US012787773B2

(12) United States Patent
Choi et al.

(10) Patent No.: US 12,787,773 B2

(45) Date of Patent: Nov. 3, 2026

(54) METHOD FOR FABRICATING SEMICONDUCTOR DEVICES USING THROUGH-DIE LASER REFLOW AND BACKSIDE THERMAL LAYER STACK FORMATION

(71) Applicant: STATS ChipPAC Pte. Ltd., Singapore (SG)

(72) Inventors: Joonyoung Choi, Incheon (KR); Woosoon Kim, Incheon (KR); Seongkwon Hong, Incheon (KR); Gayeon Kim, Seoul (KR)

( * ) Notice: Subject to any disclaimer, the term of this patent is extended or adjusted under 35 U.S.C. 154(b) by 436 days.

(21) Appl. No.: 18/332,023

(22) Filed: Jun. 9, 2023

(65) Prior Publication Data

US 2023/0411346 A1 Dec. 21, 2023

(30) Foreign Application Priority Data

Jun. 13, 2022 (CN) ......................... 202210661400.1

(51) Int. Cl.
*H10W 40/25* (2026.01)
*H10W 40/00* (2026.01)
(Continued)

(52) U.S. Cl.
CPC ....... *H10W 40/258* (2026.01); *H10W 40/037* (2026.01); *H10W 40/22* (2026.01);
(Continued)

(58) Field of Classification Search
CPC ..... H01L 21/4882; H01L 23/36; H01L 24/16; H01L 24/32; H01L 24/81;
(Continued)

(56) References Cited

U.S. PATENT DOCUMENTS 8,679,899 B2 3/2014 Chiu et al.
10,804,217 B2 10/2020 Cho et al.
(Continued)

FOREIGN PATENT DOCUMENTS

CN 1696231 A 11/2005
CN 103314435 A 9/2013
(Continued)

OTHER PUBLICATIONS

The Search Report for the Taiwanese patent application 115109439, mailed on Apr. 17, 2026.
The Search Report for the counterpart Chinese patent application 202210661400.1 mailed on Aug. 1, 2026.
The Office Action for the counterpart Korean patent application 10-2023-0067613, mailed on Jun. 7, 2026.

* cited by examiner

*Primary Examiner* — Wael M Fahmy
*Assistant Examiner* — Shamita S Hanumasagar
(74) *Attorney, Agent, or Firm* — Junhe Law Office P. C.; Yi Zhang

(57) ABSTRACT

A semiconductor device and a method for forming the same are provided. The method includes: providing a substrate; providing a semiconductor die having a first die surface and a second die surface opposite to the first die surface; attaching the first die surface to the substrate via an interconnect structure comprising solder; and irradiating the second die surface with a laser beam, wherein the laser beam passes through the semiconductor die and reflows the solder of the interconnect structure. In the method, laser-assisted bonding can is used to reflow solder bumps, and thermal interface material can be formed after the laser-assisted bonding.

8 Claims, 7 Drawing Sheets

(51) Int. Cl.

| | |
|---|---|
| ***H10W 40/22*** | (2026.01) |
| ***H10W 72/00*** | (2026.01) |
| ***H10W 74/15*** | (2026.01) |
| ***H10W 76/63*** | (2026.01) |
| ***H10W 90/00*** | (2026.01) |

(52) U.S. Cl.
CPC .... *H10W 72/072* (2026.01); *H10W 72/07235* (2026.01); *H10W 72/07236* (2026.01); *H10W 72/877* (2026.01); *H10W 74/15* (2026.01); *H10W 76/63* (2026.01); *H10W 90/724* (2026.01); *H10W 90/734* (2026.01); *H10W 90/736* (2026.01)

(58) Field of Classification Search
CPC ........... H01L 2224/116; H01L 2224/32; H01L 2224/73253; H01L 2224/81; H01L 2224/81224; H01L 2224/81815; H10W 40/037; H10W 40/258; H10W 72/07235; H10W 72/07236; H10W 72/877; H10W 74/15; H10W 90/724; H10W 90/734; H10W 90/736
See application file for complete search history.

(56) References Cited

U.S. PATENT DOCUMENTS

| | | | | |
|---|---|---|---|---|
| 2003/0132528 | A1 | 7/2003 | Liang | |
| 2007/0152325 | A1 | 7/2007 | Dani et al. | |
| 2009/0001557 | A1 | 1/2009 | Renavikar et al. | |
| 2019/0214362 | A1 | 7/2019 | Lim et al. | |
| 2020/0006192 | A1 | 1/2020 | Li et al. | |
| 2020/0411395 | A1 * | 12/2020 | Bozorg-Grayeli .... | H01L 23/053 |
| 2021/0225729 | A1 * | 7/2021 | Bozorg-Grayeli ........................... | H10W 40/257 |
| 2021/0296268 | A1 * | 9/2021 | Braganca, Jr. .... | H10W 72/0198 |
| 2023/0065147 | A1 * | 3/2023 | Wang .................. | H10W 42/121 |

FOREIGN PATENT DOCUMENTS

| | | | | | |
|---|---|---|---|---|---|
| CN | 103441109 | A | * | 12/2013 | .......... H10W 40/258 |
| CN | 112151475 | A | | 12/2020 | |
| CN | 113823573 | A | | 12/2021 | |
| JP | 2010010196 | A | | 1/2010 | |
| TW | 201501257 | A | * | 1/2015 | |
| TW | 201941376 | A | | 10/2019 | |

METHOD FOR FABRICATING SEMICONDUCTOR DEVICES USING THROUGH-DIE LASER REFLOW AND BACKSIDE THERMAL LAYER STACK FORMATION

TECHNICAL FIELD

The present application generally relates to semiconductor technology, and more particularly, to a semiconductor device and a method for making the same.

BACKGROUND OF THE INVENTION

The semiconductor industry is constantly faced with complex integration challenges as consumers want their electronics to be smaller, faster and higher performance with more and more functionalities packed into a single device. Many electronic components in the device, such as microprocessors and integrated circuits, generate significant amounts of heat during operation. Excessive heat may degrade performance, reliability, life expectancy of an electronic component and may even cause component failure. Heat sinks, heat spreaders, and other thermal solutions including thermal interface material (TIM) are commonly used for dissipating heat and reducing the operational temperature of the electronic components. Laser-assisted bonding (LAB) is a technique to apply energy on a semiconductor die to be mounted to reflow solder bumps. However, the LAB generally cannot be used with the TIM.

Therefore, a need exists for improvements to the manufacturing method of semiconductor devices.

SUMMARY OF THE INVENTION

An objective of the present application is to provide a method for making a semiconductor device, in which laser-assisted bonding (LAB) is used to reflow solder bumps, and thermal interface material (TIM) can be formed after the LAB.

According to an aspect of embodiments of the present application, a method for forming a semiconductor device is provided. The method may include: providing a substrate; providing a semiconductor die having a first die surface and a second die surface opposite to the first die surface; attaching the first die surface to the substrate via an interconnect structure including solder; and irradiating the second die surface with a laser beam, wherein the laser beam passes through the semiconductor die and reflows the solder of the interconnect structure.

According to another aspect of embodiments of the present application, a semiconductor device is provided. The semiconductor device may include: a substrate; a semiconductor die having a first die surface and a second die surface opposite to the first die surface; and an interconnect structure between the first die surface and the substrate for attaching the semiconductor die to the substrate, wherein the interconnect structure includes solder, and a laser beam irradiating the second die surface can pass through the semiconductor die to reflow the solder of the interconnect structure.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
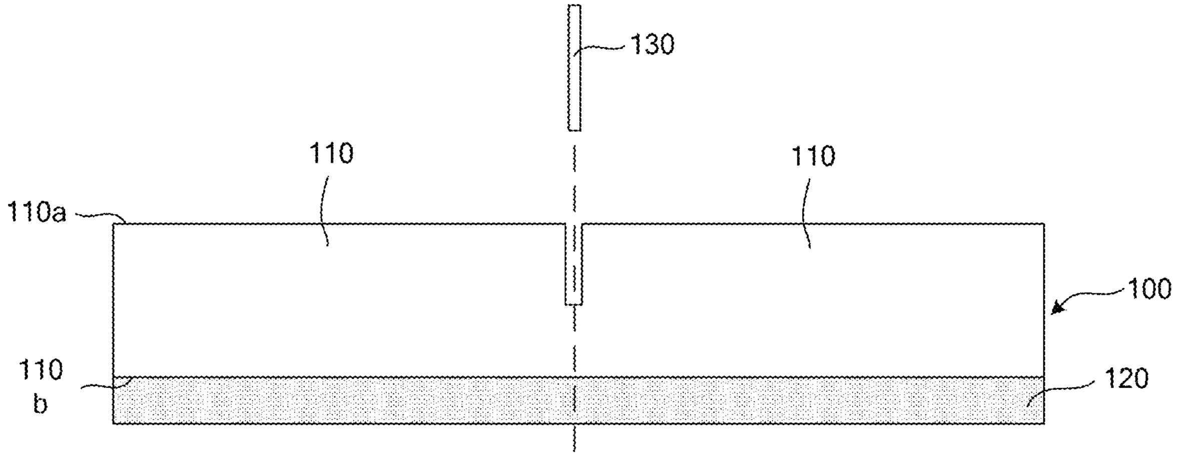
FIG. 1A (Prior Art)
FIG. 1A is a cross-sectional view of a portion of a semiconductor wafer.

Referring to FIG. 1A, a cross-sectional view of a portion of a semiconductor wafer 100 is illustrated. A plurality of semiconductor dice 110 may be formed on the semiconductor wafer 100. The plurality of semiconductor dice 110 may be separated by singulation channels, and the singulation channels can provide cutting areas to singulate the semiconductor wafer 100 into individual semiconductor dice 110. Each semiconductor die 110 has an active surface 110*a* and a non-active surface 110*b*. The active surface 110*a* may contain analog or digital circuits implemented as active devices, passive devices, conductive layers, and dielectric layers formed within the semiconductor die 110 and electrically interconnected according to the electrical design and function of the semiconductor die 110. A back side metallization (BSM) layer 120 is formed on the non-active surface 110*b* at a wafer level. Before forming the BSM layer 120, a back-grinding process is usually performed on the non-active surface 110*b* to reduce the thickness of the semiconductor die 110 and clean the non-active surface 110*b*. In an example, a titanium (Ti) layer and a copper (Cu) layer are first sputtered on the non-active surface 110*b*, and then a nickel (Ni) layer and a gold (Au) layer are plated on the copper layer to form the BSM layer 120. In addition, bump material may be formed on the active surface 110*a* of the semiconductor die 110, and is reflowed by heating the bump material above its melting point to form balls or bumps 114 (referring to FIG. 1B). Then, the semiconductor wafer 100 is singulated into individual semiconductor dice 110 at the singulation channels using a saw blade or a laser cutting tool 130. However, there may be a risk that the BSM layer 120 peels off the non-active surface 110*b*.

Figure 1B:
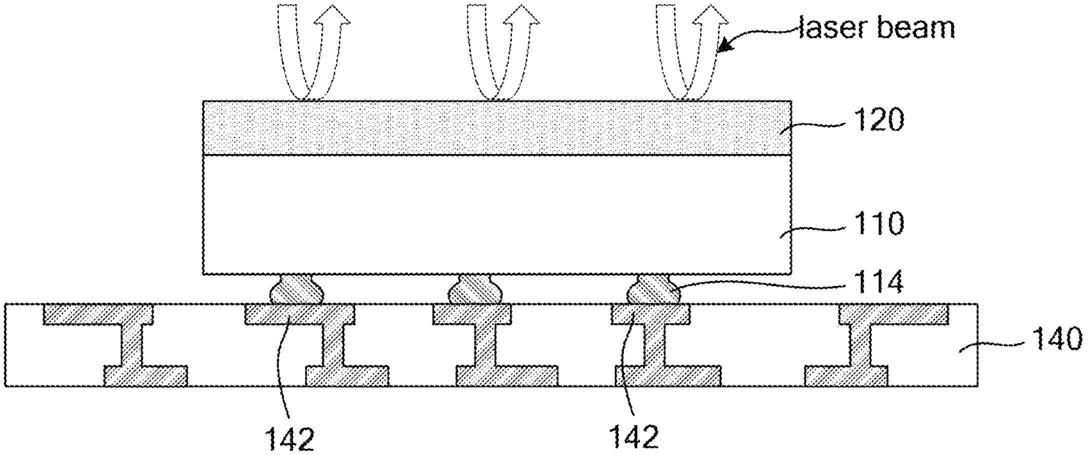
FIG. 1B (Prior Art)
FIG. 1B is a cross-sectional view of a semiconductor die mounted on a substrate.

Referring to FIG. 1B, the semiconductor die 110 is mounted on a substrate 140 to form a flip chip package. For example, the bumps 114 of the semiconductor die 110 can be welded to conductive patterns 142 of the substrate 140. As the BSM layer (i.e., Ti/Cu/Ni/Au) is not transparent to laser beams used in the laser-assisted bonding (LAB) technique, the laser beams may be reflected or absorbed by the BSM layer, as shown in FIG. 1B. Thus, the LAB technique cannot be used in the flip chip soldering process.

To address at least one of the above problems, in the embodiments of the present application, a method for forming a semiconductor device is provided. In the method, a semiconductor die without a BSM layer is singulated from a semiconductor wafer, and is then attached to a substrate. As no BSM layer is formed on the semiconductor die, a laser beam can directly irradiate to a surface of the semiconductor die, and pass through the semiconductor die to reflow the solder between the semiconductor die and the substrate. After reflowing the solder, a BSM layer and a thermal interface material (TIM) layer can be formed on the semiconductor die. By strategically designing and organizing steps of the method of the present application, the LAB can be used to reflow the solder material between the semiconductor die and the substrate, and the TIM layer can be used to improve heat dissipation of the semiconductor device.

Referring to FIGS. 2A to 2H, various steps of a method for forming a semiconductor device are illustrated. In the following, the method will be described with references to FIGS. 2A to 2H in more details.

Figure 2A:
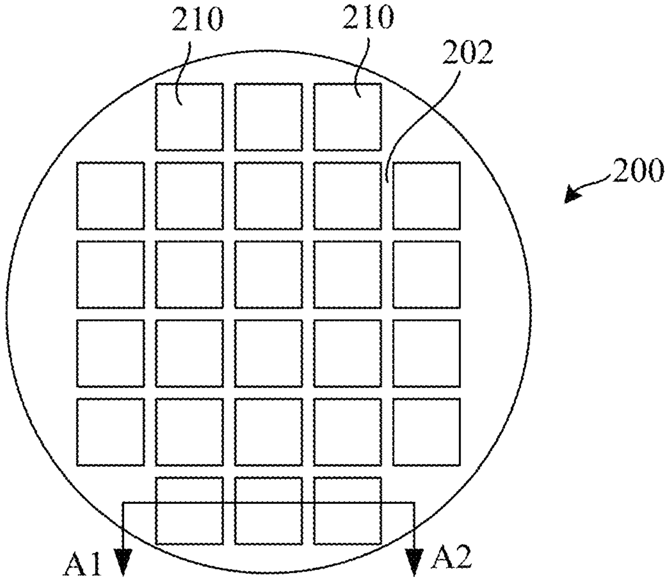
FIGS. 2A-2H illustrate various steps of a method for forming a semiconductor device according to an embodiment of the present application.
Figure 2B:
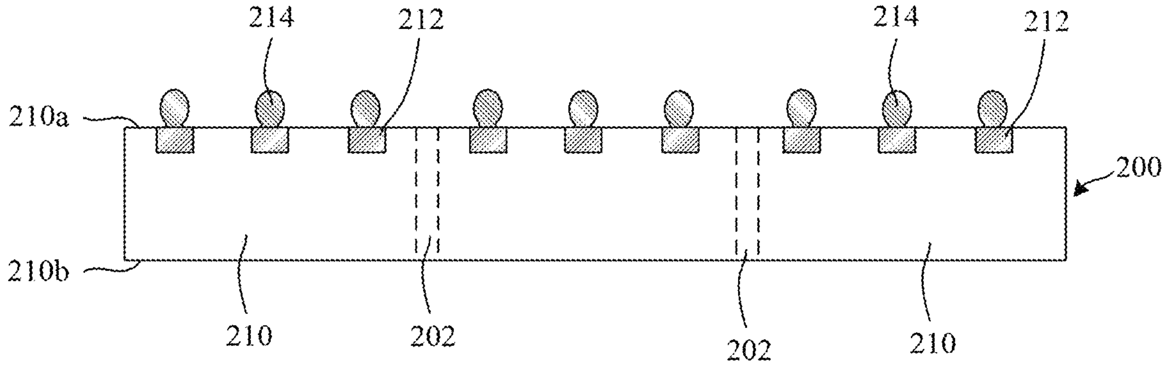

As illustrated in FIGS. 2A and 2B, a semiconductor wafer 200 is provided. FIG. 2A is a top view of the semiconductor wafer 200, and FIG. 2B is a cross-sectional view of the semiconductor wafer 200 along a section line A1-A2 shown in FIG. 2A. The semiconductor wafer 200 may include silicon, germanium, gallium arsenide, gallium nitride, indium phosphide, silicon carbide, or other material for structural support. A plurality of semiconductor dice 210 may be formed on the semiconductor wafer 200, which may be separated by singulation channels 202. The singulation channels 202 can provide cutting areas to singulate the semiconductor wafer 200 into individual semiconductor dice 210 in a later singulation process.

As shown in FIG. 2B, each semiconductor die 210 may have a first surface 210*a* and a second surface 210*b* opposite to the first surface 210*a*. The first surface 210*a* may contain analog or digital circuits implemented as active devices, passive devices, conductive layers, and dielectric layers formed within the semiconductor die 210 and electrically interconnected according to the electrical design and function of the semiconductor die 210. For example, the circuit may include one or more transistors, diodes, and other circuit elements formed within the first surface 210*a* to implement analog circuits or digital circuits, such as a digital signal processor (DSP), application specific integrated circuit (ASIC), memory, or other signal processing circuit. The semiconductor die 210 may also include integrated passive devices (IPDs), such as inductors, capacitors, and resistors formed on the first surface 210*a*. The first surface 210*a* may be an active surface on which a surface fabrication process can be implemented to form one or more of the various types of semiconductor devices as aforementioned. In contrast, the second surface 210*b* may serve as a support surface to which a carrier may be attached, rather than an active surface as the first surface 210*a*.

An electrically conductive layer 212 may be formed on the first surface 210*a*. The conductive layer 212 may include one or more layers of aluminum (Al), Cu, tin (Sn), Ni, Au, silver (Ag), or other suitable electrically conductive material, and may operate as contact pads electrically connected to the circuits of the first surface 210*a*. An interconnection structure such as conductive bumps may be formed on the conductive layer 212. In some embodiments, an electrically conductive bump material may be formed on the conductive layer 212. The bump material may include Al, Sn, Ni, Au, Ag, lead (Pb), bismuth (Bi), Cu, solder, or combinations thereof, with an optional soldering flux solution. For example, the bump material may be eutectic Sn/Pb, high-lead solder, or lead-free solder. The bump material is bonded to conductive layer 212 using a suitable attachment or bonding process. In some embodiments, the bump material can be reflowed by heating the material above its melting point to form balls or bumps 214, as shown in FIG. 2B. It could be understood that the bumps 214 represent a type of interconnection structure that can be formed over the conductive layer 212. In other embodiments, the interconnection structure may include a stud bump, a micro bump, or the like.

In some embodiments, a back-grinding process may be performed on the second surface 210*b* to reduce the thickness of the semiconductor die 210, since no active devices or circuits are formed on the second surface 210*b*. Then, the semiconductor wafer 200 may be singulated into individual semiconductor dice 210 at the singulation channels 202 using a saw blade or a laser cutting tool. The individual semiconductor dice 210 may be inspected and electrically tested for identification of known good die (KGD) after singulation.

Figure 2C:
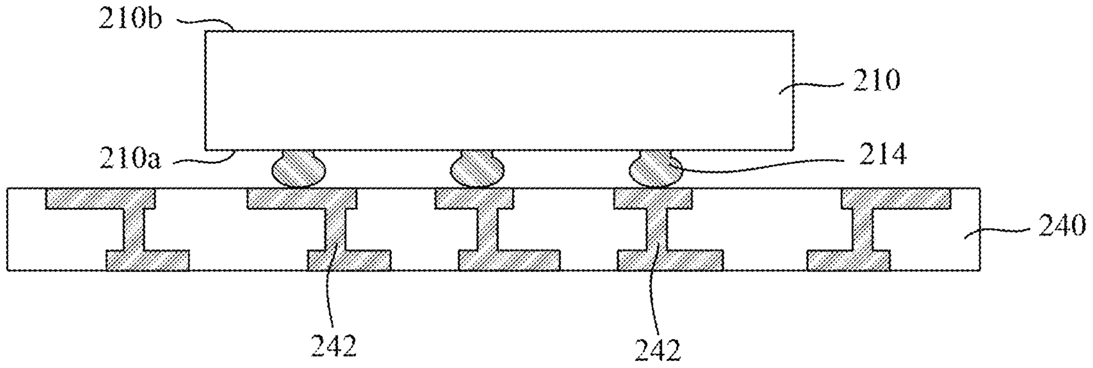

Afterwards, referring to FIG. 2C, a substrate 240 is provided, and the semiconductor die 210 is attached to the substrate 240 via the interconnect structures 214. The substrate 240 can support the semiconductor die 210 and further connect the semiconductor die 210 with other electronic components which are also mounted on the substrate 240. By way of example, the substrate 240 may include a printed wiring board or a semiconductor substrate, however, the substrate 240 is not to be limited to these examples. In other examples, the substrate 240 may be a laminate interposer, a strip interposer, a leadframe, or other suitable substrates. In accordance with the scope of the present application, the substrate 240 may include any structure on or in which integrated circuit systems are fabricated. For example, the substrate 240 may include one or more insulating or passivation layers, one or more conductive vias formed through the insulating layers, and one or more conductive layers formed over or between the insulating layers. In the example shown in FIG. 2C, redistribution structures (RDSs) 242 are formed in the substrate 240, which include a plurality of top conductive patterns on the top surface of the substrate 240, a plurality of bottom conductive patterns on the bottom surface of the substrate 240, and a plurality of conductive vias electrically connecting at least one of the top conductive patterns with at least one of the bottom conductive patterns.

The semiconductor die 210 may be positioned over the substrate 240 using a pick and place operation with the first surface 210*a* and the interconnect structure 214 oriented toward the substrate 240. The interconnect structure 214 may contact the top conductive pattern of the RDS 242 in the substrate 240.

Figure 2D:
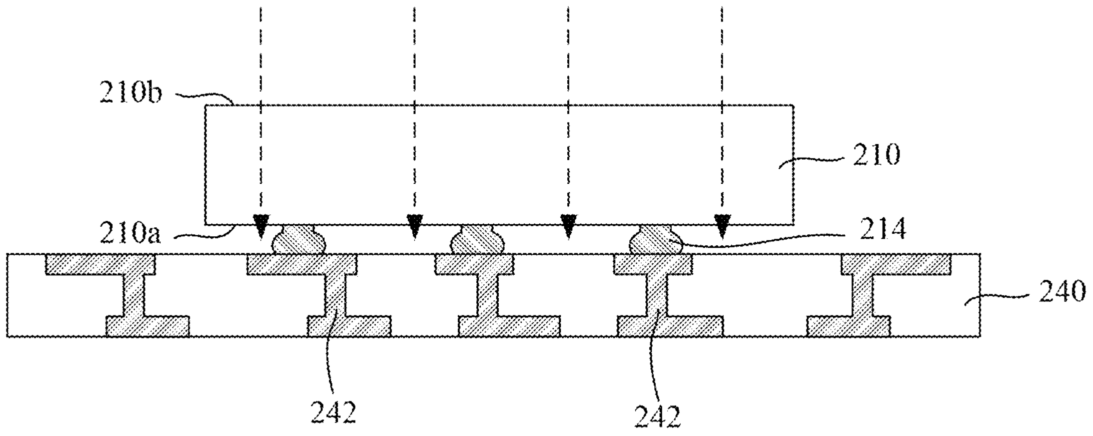

Afterwards, referring to FIG. 2D, the second surface 210*b* of the semiconductor die 210 is irradiated with a laser beam, as indicated by dashed arrows in FIG. 2D. The laser beam can pass through the semiconductor die 210 and reflow the solder of the interconnect structure 214. In some embodiments, laser-assisted bonding (LAB) can be used to implement the laser irradiation. LAB is an advanced flip chip and surface mount bonding technology in which a homogenized laser beam (that is, a two-dimensional beam, not a one-dimensional beam) is selectively applied to a chip or component in order to establish a metallurgical interconnection with a substrate. In some embodiments, an irradiation area of the homogenized laser beam may be the same as a size of the semiconductor die 210.

Specifically, as shown in FIG. 2D, the homogenized laser beam passes through the semiconductor die 210, and can apply energy directly to the solder of the interconnect structure 214. The optical energy of the homogenized laser beam can be converted into thermal energy to heat the solder of the interconnect structure 214. The solder can be heated above its melting point and reflowed to form a reliable solder interconnection between the semiconductor die 210 and the substrate 240. The heating temperature can be controlled by the irradiation power and time. In some embodiments, soldering flux may be added to the interconnect structure 214 to improve reflow of the solder material onto the pad of the substrate 240. As the laser beam can provide more localized heat than a reflow oven and is able to reflow solder with a shorter cycle time, there is a reduced likelihood of damaging the semiconductor die 210 and the interconnect structure 214 during the reflow process. In a specific example, a near infrared (NIR) laser source is employed, and the laser beam is modulated to form a homogeneous spatial power distribution to irradiate the second surface 210*b* of the semiconductor die 210 for about 3 seconds. However, the present application is not limited to the above example, and the wavelength of the laser beam and the duration of irradiation may vary depending on the material of the semiconductor die, the thickness of the semiconductor die, the size of the semiconductor die, the irradiation area of the homogenized laser beam, and/or the distance between the semiconductor die and the substrate.

Figure 2E:
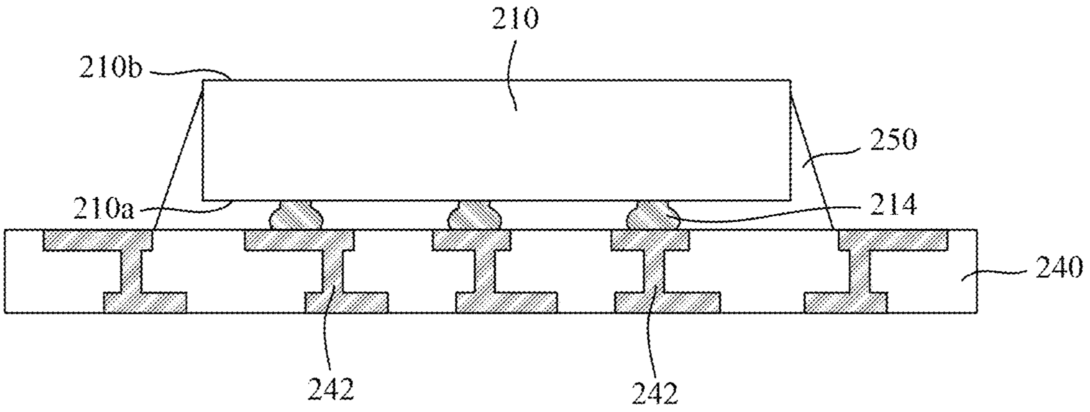

Referring to FIG. 2E, the underfill encapsulant 250 is formed between the semiconductor die 210 and the substrate 240 and optionally on side walls of the semiconductor die 210. In some embodiments, the underfill encapsulant 250 may be formed around the interconnect structure 214 between the semiconductor die 210 and the substrate 240. The underfill encapsulant 250 may include a polymer composite material, such as epoxy resin, epoxy acrylate, or polymer with or without a filler. In some examples, the underfill encapsulant 250 is formed by depositing a fluid material at a location on the substrate 240 that is next to the semiconductor die 210, and allowing capillary action to draw the fluid material into the space between the semiconductor die 210 and the substrate 240. In the example shown in FIG. 2E, the underfill encapsulant 250 also covers portions of sidewalls of the semiconductor die 210. The underfill encapsulant 250 may provide mechanical support to the interconnect structure 214, helping to mitigate the risk of crack or delamination due to differential thermal expansion between the semiconductor die 210 and the substrate 240.

Figure 2F:
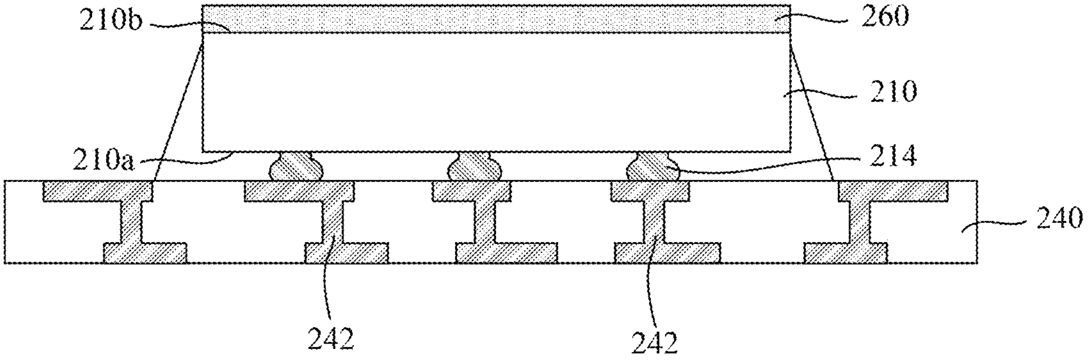

Afterwards, as shown in FIG. 2F, a back side metallization (BSM) layer 260 is formed on the second surface 210*b* of the semiconductor die 210. In some embodiments, the BSM layer 260 may include one or more materials selected from a group consisting of silver (Ag), stainless steel (SUS) and Cu. However, the BSM layer 260 is not limited to the above materials, and may include other metallic material. The BSM layer 260 may be formed by spray coating, plating, sputtering, or any other suitable metal deposition process. The BSM layer 260 can assist a TIM layer formed in subsequent process in adhering to the semiconductor die 210.

Compared with the BSM layer 120 in FIG. 1A, which is formed on the entire surface of the semiconductor wafer including unqualified dice and KGDs, the BSM layer 260 in FIG. 2F is only formed on the KGD identified after singulation. Further, the BSM layer 260 in FIG. 2F may only include one or two layers (for example, a single layer of Ag), which is simpler than the multilayered structure (i.e., Ti/Cu/Ni/Au) of the BSM layer 120 in FIG. 1A. Thus, the cost for the BSM layer can be reduced.

Figure 2G:
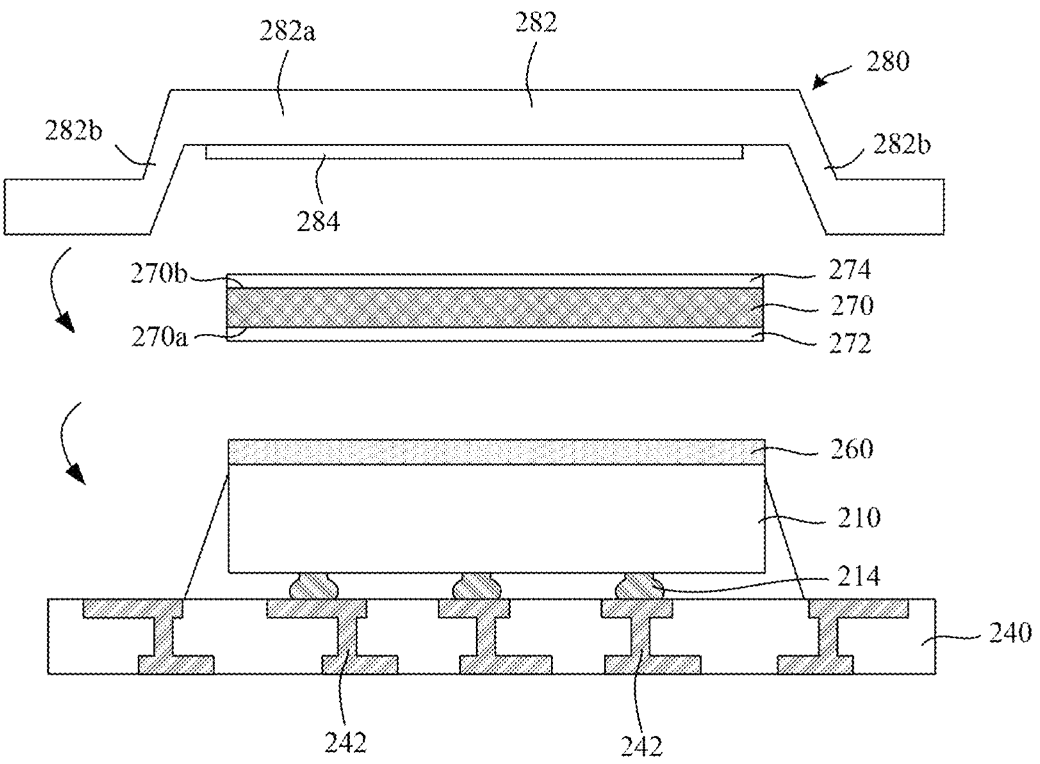

Referring to FIG. 2G, a thermal interface material (TIM) layer 270 and a heatsink 280 are provided. In some embodiments, the TIM layer 270 may include indium (In), or an indium-silver (InAg) alloy. However, the TIM layer 270 is not limited to the above materials, and may include other materials with a high thermal conductivity. The TIM layer 270 may be pre-formed, and is attached to the BSM layer 260. In an example, a first soldering flux layer 272 is formed on a first surface 270*a* of the TIM layer 270, and a second soldering flux layer 274 is formed on a second surface 270*b* of the TIM layer 270. Thus, the TIM layer 270 can be attached to the BSM layer 260 via the first soldering flux layer 272 on the first surface 270*a* of the TIM layer 270. The first soldering flux layer 272 and the second soldering flux layer 274 may facilitate reflowing of the TIM layer 270 in subsequent processes.

The heatsink 280 may also be referred to as a "heat spreader". In FIG. 2G, the heatsink 280 includes a lid 282 and a surface finish layer 284 attached to the lid 282. In the example shown in FIG. 2G, the lid 282 includes a top portion 282*a* and a foot portion 282*b*. The foot portion 282*b* may be attached to the substrate 240 using adhesive, solder or other suitable material(s) or techniques. In some embodiments, the lid 282 may include Cu, Al, Ni or other metal materials. However, the lid 282 is not limited to the above materials, and may include other materials with a high thermal conductivity. In order to facilitate the coupling between the lid 282 and the TIM layer 270, the surface finish layer 284 is formed on the underside of the top portion 282*a* of the lid 282. The surface finish layer 284 can also prevent oxidation of the lid 282. In the example shown in FIG. 2G, the surface finish layer 284 may be attached to the TIM layer 270 via the second soldering flux layer 274 on the second surface 270*b* of the TIM layer 270. The surface finish layer 284 may include a suitable material to wet the TIM layer 270. In some embodiments, the surface finish layer 284 may include Au. However, the surface finish layer 284 is not limited to Au, and may include other materials such as Ag or In.

Figure 2H:
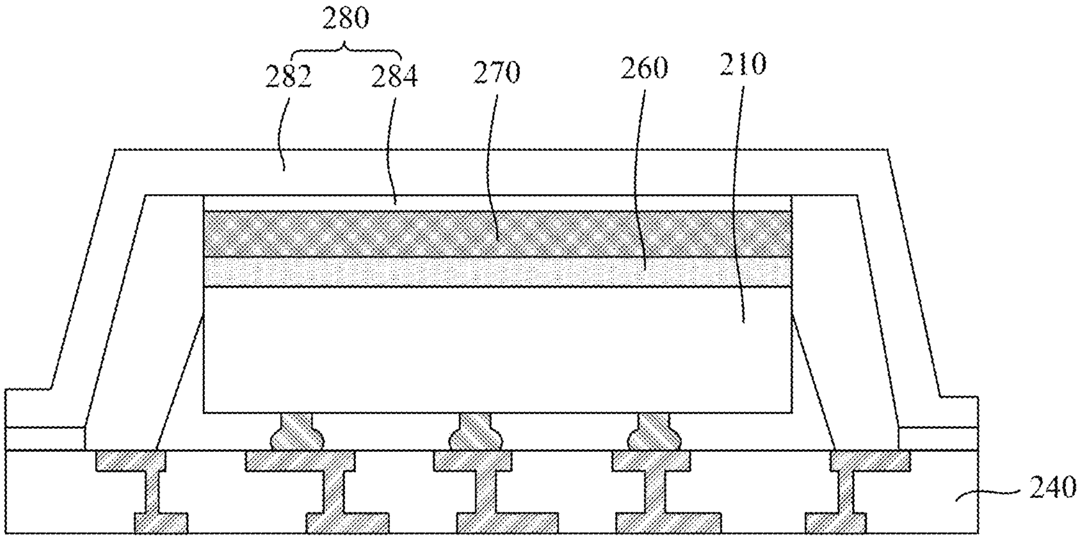

Afterward, referring to FIG. 2H, the TIM layer 270 is reflowed to solder the TIM layer 270 and the BSM layer 260 together and solder the TIM layer 270 and the heatsink 280 together. Specifically, the TIM layer 270 may be heated above its melting point, such that the soldering flux between the TIM layer 270 and the BSM layer 260 may escape into the environment, and the TIM layer 270 and the BSM layer 260 may react and form an intermetallic compound (IMC). The IMC can enhance the adhesion between the TIM layer 270 and the BSM layer 260. Similarly, when the TIM layer 270 is heated above its melting point, the soldering flux between the TIM layer 270 and the surface finish layer 284 of the heatsink 280 may escape into the environment, and the TIM layer 270 and the surface finish layer 284 may react and form another IMC to enhance the adhesion between the TIM layer 270 and the surface finish layer 284. Consequently, the semiconductor die 210, the BSM layer 260, the TIM layer 270 and the surface finish layer 284 are thermally coupled to the lid 282 of the heatsink 280.

Figure 3:
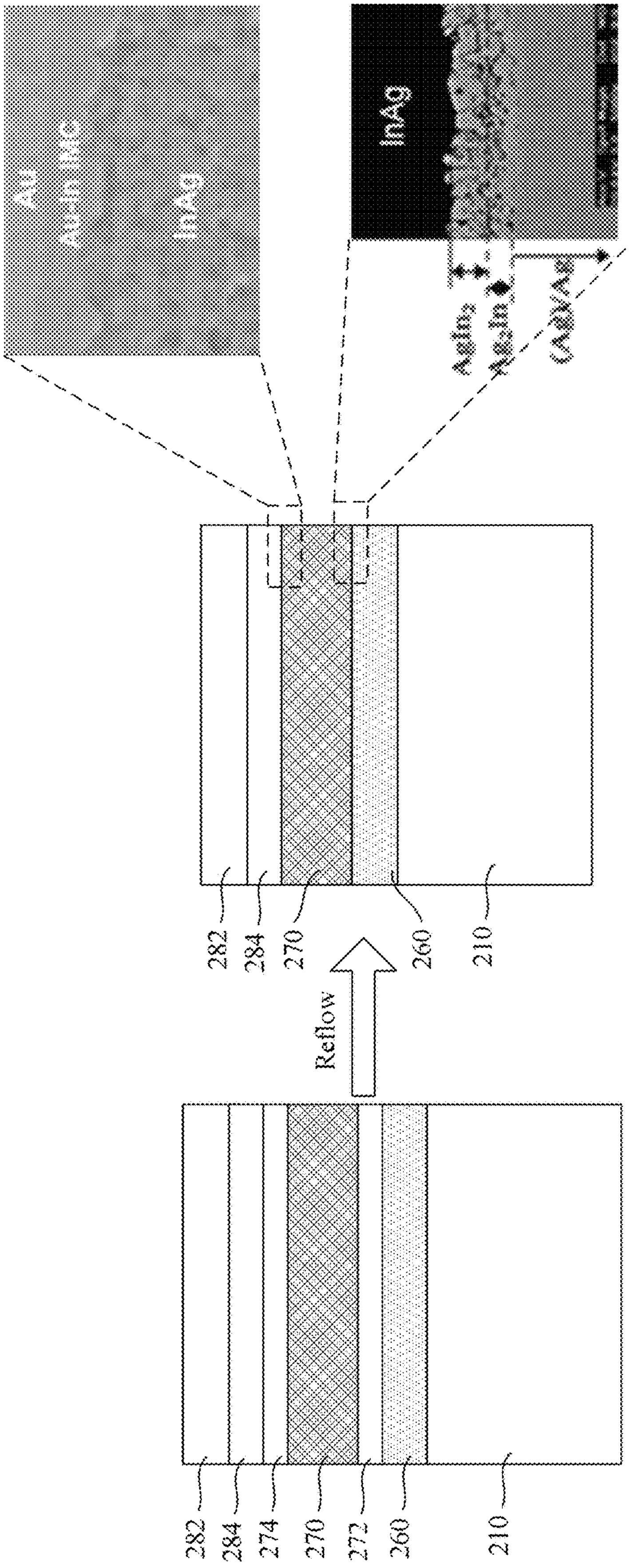
FIG. 3 is a schematic diagram illustrating reactions between a thermal interface material (TIM) layer and a back side metallization (BSM) layer and between the TIM layer and a heatsink.

FIG. 3 is a schematic diagram illustrating the reactions between the TIM layer 270 and the BSM layer 260 and between the TIM layer 270 and the surface finish layer 284 of the heatsink 280 shown in FIG. 2G.

In the example shown in FIG. 3, the surface finish layer 284 is made of Au, the TIM layer 270 is made of In or InAg, and the BSM layer 260 is made of Ag. In the reflowing process, the TIM layer 270 heated to about 190 degrees Celsius (° C.), which is above the melting point of In (i.e., 157° C.). As shown in the inserted microscopic images in FIG. 3, the TIM layer 270 and the BSM layer 260 reacts and forms $AgIn_2$ and $Ag_2In$ IMCs therebetween, and the TIM layer 270 and the surface finish layer 284 reacts and forms Au—In IMC therebetween. As can be seen, the strategically designed or selected materials of the surface finish layer 284, the TIM layer 270 and the BSM layer 260 can reduce the peak temperature in the reflowing process of the TIM layer 270.

Figure 4:
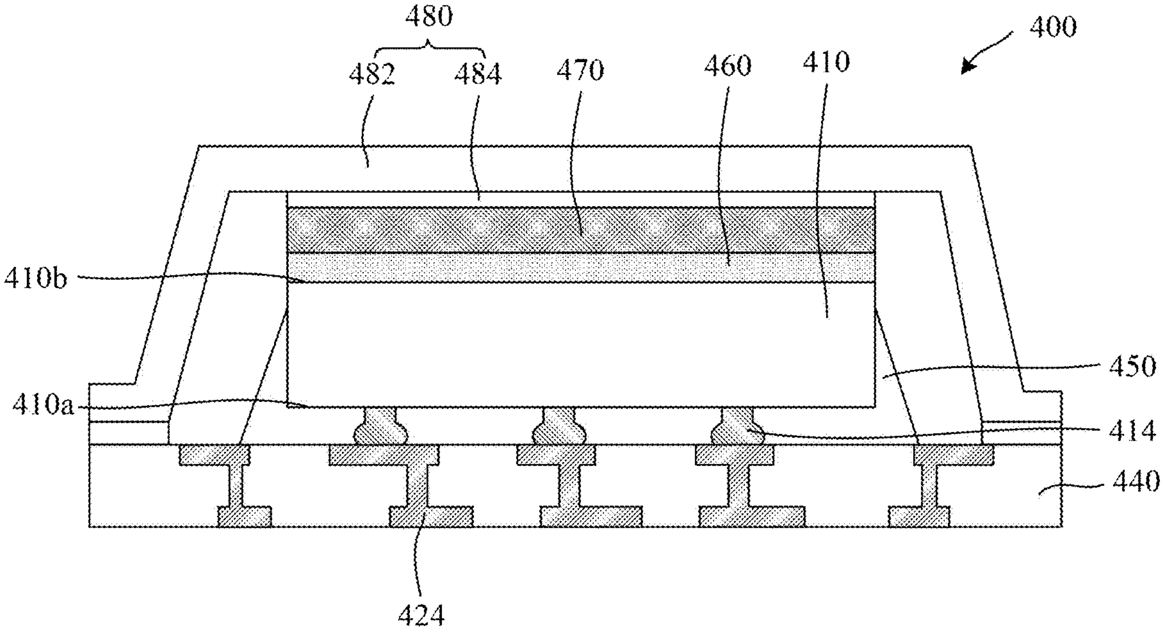
FIG. 4 is a cross-sectional view of a semiconductor device according to an embodiment of the present application.

According to another aspect of the present application, a semiconductor device is provided. Referring to FIG. 4, a cross-sectional view of a semiconductor device 400 is illustrated according to an embodiment of the present application.

As illustrated in FIG. 4, the semiconductor device 400 may include a substrate 440, a semiconductor die 410, and an interconnect structure 414. The semiconductor die 410 may have a first surface 410*a* and a second surface 410*b*. The interconnect structure 414 is disposed between the first surface 410*a* of the semiconductor die 410 and the substrate 440 for attaching the semiconductor die 410 to the substrate 440. The interconnect structure 414 may include solder, and a laser beam irradiating the second surface 410*b* of the semiconductor die 410 can pass through the semiconductor die 410 to reflow the solder of the interconnect structure 414.

In some embodiments, the semiconductor device 400 may further include an underfill encapsulant 450. The underfill encapsulant 450 is disposed between the semiconductor die 410 and the substrate 440 and surrounds the interconnect structure 414. The underfill encapsulant 450 may include polymer composite material, such as epoxy resin, epoxy acrylate, or polymer with or without a filler. The underfill encapsulant 450 may provide mechanical support to the interconnect structure 414, helping to mitigate the risk of cracking or delamination due to differential thermal expansion between the semiconductor die 410 and the substrate 440.

In some embodiments, the semiconductor device 400 may further include a BSM layer 460. The BSM layer 460 is disposed on the second surface 410*b* of the semiconductor die 410. The BSM layer 460 may include one or more materials selected from a group consisting of Ag, SUS and Cu.

In some embodiments, the semiconductor device 400 may further include a TIM layer 470 and a heatsink 480. The TIM layer 470 is disposed on the BSM layer 460, and the heatsink 480 is disposed on the TIM layer 470. The TIM layer 470 may include In or InAg. The heatsink 480 may include a lid 482 and a surface finish layer 484 attached to the lid 482. The surface finish layer 484 is disposed between the lid 482 and the TIM layer 470.

The semiconductor device 400 may be formed by the method described above with reference to FIGS. 2A to 2H, and FIG. 3. Thus, more details about the semiconductor device 400 may be referred to the disclosure and drawings about the method disclosed above, and will not will not be elaborated herein.

The discussion herein included numerous illustrative figures that showed various portions of a semiconductor device and a method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for forming a semiconductor device, comprising:

providing a substrate;

providing a semiconductor die having a first die surface and a second die surface opposite to the first die surface, wherein the semiconductor die is singulated from a semiconductor wafer;

attaching the first die surface to the substrate via an interconnect structure comprising solder;

irradiating the second die surface with a laser beam, wherein the laser beam passes through the semiconductor die and reflows the solder of the interconnect structure;

after irradiating the second die surface with the laser beam, forming a back side metallization (BSM) layer on the second die surface;

providing a thermal interface material (TIM) layer having a first TIM surface and a second TIM surface opposite to the first TIM surface;

attaching the first TIM surface to the BSM layer; and attaching a heatsink to the second TIM surface.

2. The method of claim 1, wherein the BSM layer comprises one or more materials selected from a group consisting of silver, stainless steel and copper.

3. The method of claim 1, wherein the TIM layer comprises indium, or an indium-silver alloy.

4. The method of claim 1, wherein the heatsink comprises a lid and a surface finish layer attached to the lid, and the heatsink is attached to the TIM layer via the surface finish layer.

5. The method of claim 1, further comprising:

forming an underfill encapsulant between the semiconductor die and the substrate and surrounding the interconnect structure.

6. The method of claim 1, wherein providing the semiconductor die comprises:

providing the semiconductor wafer comprising the semiconductor die;

singulating the semiconductor die from the semiconductor wafer; and identifying the semiconductor die as a known good die (KGD) by inspection and electrical testing.

7. The method of claim 1, further comprising:

reflowing the TIM layer to solder the TIM layer and the BSM layer together and solder the TIM layer and the heatsink together.

8. The method of claim 1, further comprising:

forming soldering flux on the first TIM surface and the second TIM surface, wherein the first TIM surface is attached to the BSM layer via the soldering flux on the first TIM surface, and the heatsink is attached to the second TIM surface via the soldering flux on the second TIM surface.

* * * * *